United States Patent
Distefano et al.

Patent Number: 6,007,349
Date of Patent: *Dec. 28, 1999

[54] FLEXIBLE CONTACT POST AND POST SOCKET AND ASSOCIATED METHODS THEREFOR

[75] Inventors: Thomas H. Distefano, Monte Sereno; Joseph Fjelstad, Sunnyvale, both of Calif.

[73] Assignee: Tessera, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/775,945

[22] Filed: Jan. 3, 1997

Related U.S. Application Data

[60] Provisional application No. 60/009,658, Jan. 4, 1996.

[51] Int. Cl.$^6$ .................................................. H01R 9/09
[52] U.S. Cl. ............................... 439/71; 29/842; 439/66; 228/4.2
[58] Field of Search ................................. 439/71, 66, 70, 439/81; 228/180.22; 29/842, 844

[56] References Cited

U.S. PATENT DOCUMENTS

| | | | |
|---|---|---|---|
| 4,716,049 | 12/1987 | Patraw | 439/96 |
| 4,813,129 | 3/1989 | Karnezos | 439/74 |
| 4,902,606 | 2/1990 | Patraw | 439/66 |
| 5,055,907 | 10/1991 | Jacobs | 357/71 |
| 5,072,520 | 12/1991 | Nelson | 29/874 |
| 5,163,834 | 11/1992 | Chapin et al. | 439/66 |
| 5,180,311 | 1/1993 | Schreiber et al. | 439/67 |
| 5,192,716 | 3/1993 | Jacobs | 437/209 |
| 5,194,930 | 3/1993 | Papathomas et al. | 257/773 |
| 5,203,076 | 4/1993 | Banerji et al. | 29/840 |
| 5,249,101 | 9/1993 | Frey et al. | 361/717 |
| 5,299,939 | 4/1994 | Walker et al. | 439/74 |
| 5,329,423 | 7/1994 | Scholz | 439/767 |
| 5,430,614 | 7/1995 | Difrancesco | 361/785 |

Primary Examiner—Steven L. Stephan
Assistant Examiner—T C Patel
Attorney, Agent, or Firm—Lerner, David, Littenberg, Krumholz & Mentlik, LLP

[57] ABSTRACT

Flexible connectors having substantially vertical conductive legs allowing the connectors to accommodate deflection in the lateral directions (x-y directions in the plane of the connectors) induced by CTE mismatches between a chip and a substrate during thermal cycling of the chip. The connectors also accommodate deflections in the vertical direction (z direction—perpendicular to the plane of the connectors) which may be caused by connection to a substrate. Such substantially vertical leg features are formed using projection lithography, such as projected x-ray or ultra-violet ("UV") radiation, to selectively expose a photoresist layer such that the substantially vertical metal features may be formed by plating or etching. The sacrificial layer may be in the form of an array of posts, such that "stool-like" post connectors are created, or may be in the form of an array of apertures, such that "basket-like" receptacles or sockets are created. Such a flexible connector may be used in different applications resulting in superior device characteristics, such as: 1) a replacement for flip chip (C4) solder connections or for BGA solder connections; 2) a flexible socket element; or 3) a flexible thermal coupling element.

53 Claims, 8 Drawing Sheets

FLEXIBLE CONTACT POST AND POST SOCKET AND ASSOCIATED METHODS THEREFOR

CROSS REFERENCE TO RELATED APPLICATIONS

The present application claims the benefit of U.S. Provisional Application Serial No. 60/009,658 filed Jan. 4, 1996.

FIELD OF THE INVENTION

The present invention relates to the art of electronic packaging, and more specifically to structures and methods used in interconnecting opposing microelectronic components.

BACKGROUND OF THE INVENTION

In attempting to use the area on printed wiring boards more efficiently, semiconductor chip manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs") and chip size packages ("CSPs"). Using BGA technology, semiconductor chips are typically interconnected to their supporting substrates using solder connections, such as with "flip-chip" technology. However, when solder alone is used to interconnect the chip contacts to the substrate, the columns of solder are generally designed to be short to maintain the solder's structural integrity. This results in significant elastic solder deformation during operation (thermal cycling) of the device which further results in increased susceptibility to solder cracking due to the mechanical stress of the differential coefficient of thermal expansion ("CTE") of the chip relative to the supporting substrate thereby reducing the reliability of the solder connection. In other words, when the chip heats up during use, both the chip and the substrate expand; and when the heat is removed, both the chip and the substrate contract. The problem that arises is that the chip and the substrate expand and contract at different rates and at different times, thereby stressing the interconnections between them. As the features of semiconductor chips continue to be reduced in size, the number of chips packed into a given area will be greater and the heat dissipated by the each of these chips will have a greater effect on the thermal mismatch problem. This further increases the need for a highly compliant interconnection scheme for the chips.

The solder cracking problem is exacerbated when more than one semiconductor chip is mounted in a package, such as in a multichip module. Multi-chip modules continue to grow in popularity; however, as more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing the overall rigidity of the connection between the module and its supporting substrate.

Still other prior art solutions make use of a underfill material disposed between the chip and the supporting substrate in an attempt to reduce the stress caused by CTE mismatch. Without the underfill material, this stress is typically concentrated at the weakest part of the solder balls. The underfill material allows this stress to be more uniformly spread out over the entire surface of the chip, supporting substrate and solder balls. Examples of the use of underfill materials may be found in U.S. Pat. Nos. 5,194,930, 5,203,076 and 5,249,101. All of these prior art solutions are aimed at reducing the shear stress endured by the interconnections caused by thermal cycling. However, each of these solutions also encounters significant problems such as insufficient compliancy and process cost.

U.S. Pat. Nos. 4,716,049 and 4,902,606 disclose a method for providing compressive pedestals in order to form spring-loaded connectors. However, the connectors made by the methods disclosed in these patents necessarily result in a pedestal having a rounded top which transition into legs that slope outwardly from the center/top of the pedestal. This limitation to the tops and legs substantially reduces the lateral (x-y) flexibility of the pedestal and the height of the pedestal in relation to its diameter at its base. Further, the thickness of the vacuum deposited metal legs is reduced significantly as the slope of the legs is increased such that they are substantially vertical or perpendicular to the chip surface. Thus, the pedestal disclosed in these patents is not satisfactory for use as a flexible connector where significant x-y compliance is required in the plane of the contacts.

U.S. Pat. Nos. 5,055,907 and 5,192,716 disclose structure and a method for producing a thin film multilayer wiring substrate having "reach-through" metallized vias designed to connect to chip contacts. These disclosed via connections are disclosed as being made of a metal which is different than the metal used in the wiring substrate so that the vias may be removed if rework is required. However, in many configurations, it is likely such solid metal vias or thin walled, hollow metal vias do not provide adequate CTE mismatch compensation during thermal cycling because the vias have no way to "flex" in response to the differential expansion rates of the attached structures.

Despite these and other efforts in the art, still further improvements in interconnection technology would be desirable.

SUMMARY OF THE INVENTION

One aspect of the invention provides a flexible connector for interconnecting microelectronic devices. A connector according to this aspect of the invention preferably includes one or more conductive legs each having a first and a second end, a top connected to the first end or each leg and a base connected to the second end of each leg. Most preferably, the top and the base have opposing substantially parallel surfaces and each leg is substantially vertical with respect to the base and the top. That is, each leg extends at a substantial angle with respect to the top and base. The legs provide flexibility so that the connector may laterally or vertically deflect in response to relative dimensional changes of the interconnected microelectronic devices. The connectors according to this aspect of the invention can be provided in a "male" configuration, in which the base lies on a surface of a microelectronic device or other substrate, and the legs and top project away from the base. Alternatively, the connectors can be provided in a "female" configuration, in which the base is disposed remote from the substrate and in which the top is attached to the substrate. The base may have an opening therein so that the legs and base cooperatively form a socket open at the base for receipt of a bump lead or other connecting element on a mating device.

Accordingly, the present invention provides a flexible contact post and post socket and associated methods to manufacture therefore in order to accommodate for the thermal expansion mismatch between differing microelectronic devices, such as semiconductor chips or supporting substrates.

More specifically, one aspect of the present invention provides a flexible connector for interconnecting microelectronic devices. Typically, the connector has one or more conductive legs each having a first and a second end. The connector further has a top connected to the first end of each leg and a base connected to the second end of each leg, wherein the top and the base have opposing substantially planar surfaces arranged in parallel planes. Each leg is substantially vertical (as defined herein) with respect to the top and base of the connector. This arrangement of connector features allows the connector to laterally and/or vertically deflect in response to relative dimensional changes of the interconnected microelectronic devices.

In one embodiment, the base of the connector is connected to an electrically conductive contact (or is the contact itself) on the first microelectronic device and the top of the connector is abutted against an electrically conductive contact on the second microelectronic device thereby making electrical connection between the contacts on the respective microelectronic devices. The top of the connector may also be bonded to its respective contact, as by solder or other suitable conductive bonding agent. If desired, a compliant layer may be disposed between the juxtaposed microelectronic devices and around the connector.

In another embodiment, the connector top is connected to a contact (or is the contact itself) on a first microelectronic device, such as a dielectric substrate. The base is positioned above the connector top and has an electrically conductive region encircling a central aperture. This configuration allows a bump lead extending from a second microelectronic device juxtaposed with the substrate to be aligned with the aperture in the base and inserted therein causing the base and/or legs to wipe against the bump lead during such insertion. The base may have one or more discontinuities therein to allow the base to flex outwardly away from the central aperture in response to an inserted bump lead. Further, the base and/or legs may have asperities thereon, whereby the asperities facilitate the wiping of a bump lead inserted into the connector.

In another aspect of the present invention a method of manufacturing a flexible connector for microelectronic devices is disclosed. First, a conductive contact is provided on a first microelectronic device. A dielectric post is next selectively deposited or attached on top of the conductive contact, wherein the post has one or more substantially vertical sidewalls and a top surface that is substantially planar with the conductive contact. Next, one or more connector legs is selectively provided, as by projection lithographic techniques such that each leg extends up a side wall to the top of the dielectric post. A conductive connector top is further provided atop the dielectric post and connected to each leg. Optionally, the dielectric post may next be removed to leave the conductive connector. The connector may be abutted or bonded to a contact on a juxtaposed second microelectronic device.

In another aspect of the present invention a method of manufacturing a bump lead socket connector for microelectronic device is disclosed. First, a conductive contact is provided on a first microelectronic device, such as a dielectric substrate. A dielectric layer is next provided on the contact bearing surface of the first microelectronic device and an aperture is selectively defined in the dielectric layer such that the contact is exposed, wherein the aperture has at least one side wall. One or more connector legs is selectively provided so that each leg extends from the contact on the first microelectronic device to the top of the dielectric layer. A conductive base is provided at the top of the dielectric layer so that the base has a central aperture therein. The dielectric layer is then removed so that the connector may receive a bump lead from a juxtaposed microelectronic device, such as a BGA semiconductor chip.

The foregoing and other advantages of the present invention will be better understood from the following Detailed Description of a Preferred Embodiment, taken together with the attached Figures.

DETAILED DESCRIPTION OF A PREFERRED EMBODIMENT

The present invention provides for flexible connectors having substantially vertical conductive legs allowing the connectors to accommodate deflection in the lateral directions (x-y directions in the plane of the connectors) induced by CTE mismatches between a chip and a substrate during thermal cycling of the chip. The connectors also accommodate deflections in the vertical direction (z direction—perpendicular to the plane of the connectors) which may be caused by connection to a substrate. Such substantially vertical leg features are formed using projection lithography, such as projected x-ray or ultra-violet ("UV") radiation, to selectively expose a photoresist layer such that the substantially vertical metal features may be formed by plating or etching. The sacrificial layer may be in the form of an array of posts, such that "stool-like" post connectors are created, or may be in the form of an array of apertures, such that "basket-like" receptacles or sockets are created. Such a flexible connector may be used in many different applications resulting in superior device characteristics, such as: 1) a replacement for flip chip (C4) solder connections or for BGA solder connections; 2) a flexible socket element; or 3) a flexible thermal coupling element. These differing uses are described below with examples of their associated methods of manufacture.

I. Plating/Sputtering

A. Post Contact

Figure 1:
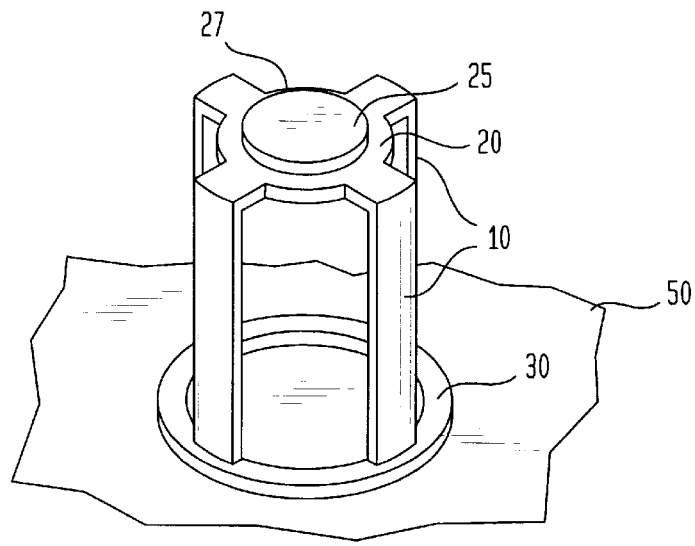
FIG. 1 shows a perspective view of a flexible connector, according to the present invention.

An all metal electrically conductive and/or thermally conductive post contact connector may be constructed to compensate for TCE mismatch problems without the need for underfill or encapsulation. As shown in FIG. 1, the physical structure is somewhat "stool-like" having one or more leg(s) 10 and typically having three or four legs. A one leg connector is possible, but would require special care to avoid being damaged, two or more legs are thus preferred. The length of the legs is fairly large relative to the other features of the connector, such as its width or thickness. The post connector further having a substantially coplanar top 20 and base surface 30. The legs 10 being substantially vertical with respect to the plane of the top 20 and the base 30.

In one embodiment, the present invention may be manufactured as shown in FIGS. 2–5. As shown in FIG. 2A, a conductive base 30 is first attached to a supporting substrate 50, such as a chip, wafer or a chip carrier. Typically, the base 30 is attached to a contact pad on the supporting substrate; however, the base 30 may be positioned such that it is merely in electrical contact to or is the termination point of a conductive trace. Alternately, the base may be the substrate contact pad itself. The base 30 may further be comprised of a continuous conductive sheet or may take the form of a ring, as shown in FIG. 1. As used here, the term "ring" need not be circular in shape, but merely continuous around a central aperture). The base 30 may be comprised of any suitable conductive metal, such as gold, copper, nickel, aluminum or alloys or combinations thereof. If an oxidizable material is used as a base, preferably it will also have a thin layer of a non-oxidizing, conductive metal (such as gold) plated on its exposed surfaces.

Figure 2A:
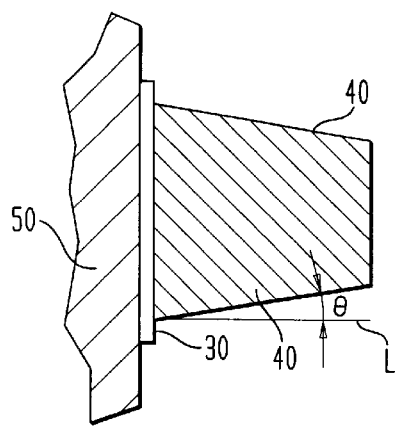
FIGS. 2–4 show various side and top views of a method to manufacture a conductive, flexible post contact, according to the present invention.
Figure 2B:
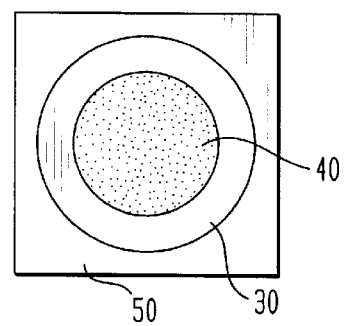

A post 40 of a dielectric sacrificial material is then selectively deposited on top of the base so that a periphery portion of the base is exposed. The post is preferably comprised of a material which can be selectively deposited, selectively removed or deposited and selectively manipulated using conventional chip packaging equipment and chemicals. Photoresist is one such possible sacrificial post material. Such a photoresist post may be selectively deposited or laminated or formed into a post by photo lithography and subsequently chemically removed. As described in more detail the alternate embodiments below, the post 40 may also be made of a dielectric material that remains in place, and may be comprised of a low modulus material (100 to $10^5$ psi). The post is typically between about 100 and 500 microns thick, and preferably about 200 microns thick. The side walls of the post are substantially vertical, which for this application is defined as slightly tapering from the base to the top of the post. This taper is generally between about 0 and 20 degrees ($\theta$) relative to a line (L) which is drawn orthogonal to the plane of the base, and preferably between about 5 and 15 degrees from line L, as shown in FIG. 2A. The angle $\theta$ defining the taper may be inward or outward from the base to the top of the post.

Figure 3A:
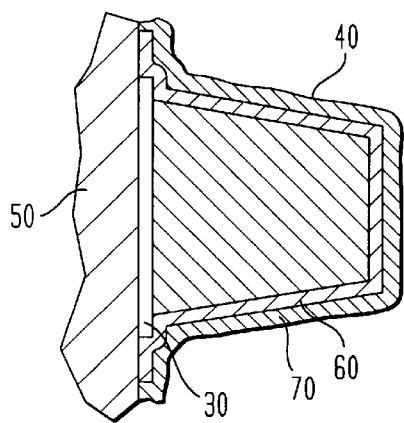
Figure 3B:
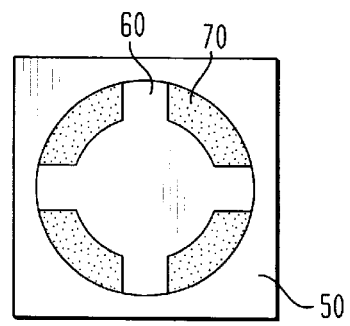
Figure 4A:
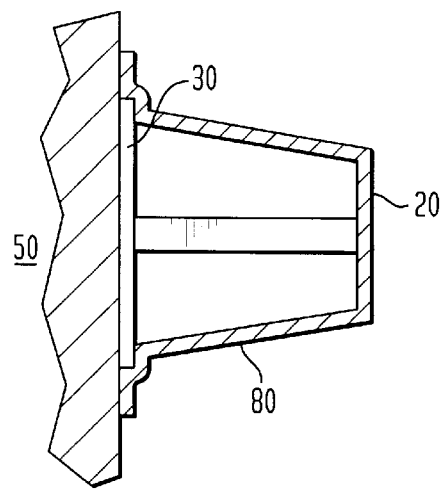
Figure 4B:
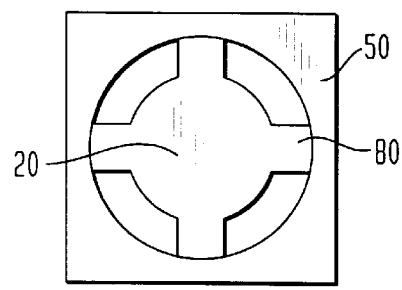

A plating seed material (not shown), such as palladium, palladium sulfide, carbon or other suitable material, is then blanket deposited. As shown in FIGS. 3A and 3B, a thin layer of a first metal 60 is then plated on top of the plating seed material. Electroless nickel is a possible metal to comprise such a first metal layer. Other examples of possible first metal layer materials include gold, copper and palladium. In some embodiments, a thin (5 to 10 $\mu$m) adhesion promoting layer may be deposited before the first metal layer. Typical examples of such adhesion promoting layers include cobalt, chrome or nickel.

The entire metallized surface (substrate/post) is then coated with a conformal coating of electrophoretic photoresist material 70, as shown in FIG. 3A. One possible example of such a resist is Shippley Eagle electrophoretic resist.

The resist 70 is then exposed by means of projection lithography in order to selectively expose a three dimensional pattern in the photoresist atop the metallized sacrificial post such that the resist may be selectively removed to expose the first metal layer below in the design of the contemplated post contact. The projected energy is used in conjunction with a mask to collimate the energy and better define the features of the connector. Collimated x-ray or deep UV radiation are examples of possible types of projected energy which are suitable as effective, low cost means of performing projection lithography that allow for the patterning of surfaces that are not flat. If x-ray lithography is chosen, a trace amount of organometallic salt may also be added to the photoresist prior to the depositing step in order to better sensitize it to x-rays. A suitable x-ray source is a standard x-ray tube having a molybdenum electrode operating at around 30 KeV. If photoresist is used as the sacrificial post, the post is protected from being developed by the x-rays by the metallic layer(s). The resist is then developed so that the undesired portions of the resist may be removed thereby selectively exposing the post connector features of the first metal layer.

The mask is comprised of a material which is resistant to the penetration of the energy source used for the projection lithography. If x-ray radiation is used, the mask may be made of lead, or lead plated onto copper or other suitable base mask material. In one preferred embodiment, the mask is comprised of a polyimide substrate having a copper layer on one surface thereof. The copper layer may then be etched to form the proper mask features and a lead layer may then be plated on top of the copper layer. Such a mask may be dimensionally stabilized by attaching the polyimide substrate to a supporting ring or frame. Typically, such a ring/frame is CTE match to whatever is being used as the supporting substrate.

An electroplating operation is next performed such that a thicker second metal layer 80 is plated within the removed portions of the photoresist to a total thickness of between 0.5 and 10 microns, and preferably about 5 microns. In a preferred embodiment, the second metal layer 80 is comprised of a layer of nickel electroplated on top of the electroless nickel in a sulfanate plating bath. Examples of other possible second metal layers include nickel, copper, gold, titanium and alloys and composite combinations thereof, such as nickel-titanium alloys and similar superplastic alloys.

After the second metal layer 80 has been deposited, the electrophoretic photoresist 70 and the sacrificial post material 40 are removed, generally by chemical means. The remaining three dimensional conductive contact structure, shown in FIGS. 4A and 4B, has a "stool-like" shape, typically having 3, 4 or more legs.

The remaining photoresist is then stripped to expose any unwanted metallic layer portions. These undesired metallic portions may be etched away. An array of such post-stool contacts maybe simultaneously constructed on a chip, a wafer or a chip carrier substrate using this technique.

Figure 5:
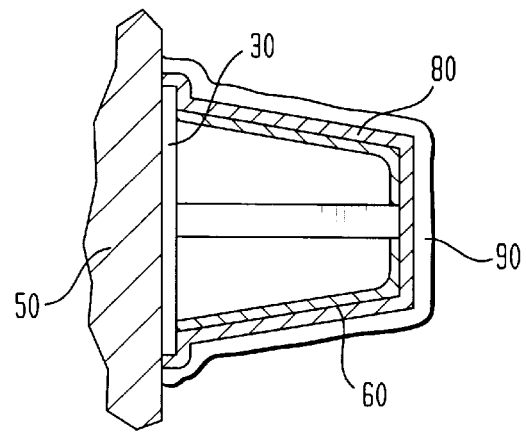
FIG. 5 shows a side view of the flexible, conductive contact structure shown in FIG. 4 with a non-oxidizing barrier layer deposited thereon, according to the present invention.

If desired, a barrier layer 90, as shown in FIG. 5, may be electroplated around the surfaces of the post stool contacts to obtain better conductivity and ensure that the contacts do not oxidize. Gold is one example of a good barrier layer. Typically, the exposed areas are electroplated in a gold-cyanide bath to a typical thickness of between 0.5 and 10 microns, and preferably between about 2 and 5 microns.

The aforementioned methods result in a compliant post contact which may achieve a height to diameter ratio of about 1 to 1 or greater, thus producing a structure which is inherently flexible in a full range of motion (x-y-z) if the proper materials are used in constructing the post contact. The flexible legs are substantially vertical in order to provide lateral (x-y) flexibility. The legs may also bow in or out in response to a compressive force thereby providing z-compliancy. The tops of the post contacts are substantially flat in order to create a large area joint when attached to a circuitized substrate, such as a printed wiring board ("PWB"). Further, the post contacts are comprised of a flexible metal that is substantially uniform in thickness at every point of the contact in order to provide flexible links that exhibit high reliability.

B. Socket Contact

Figure 7A:
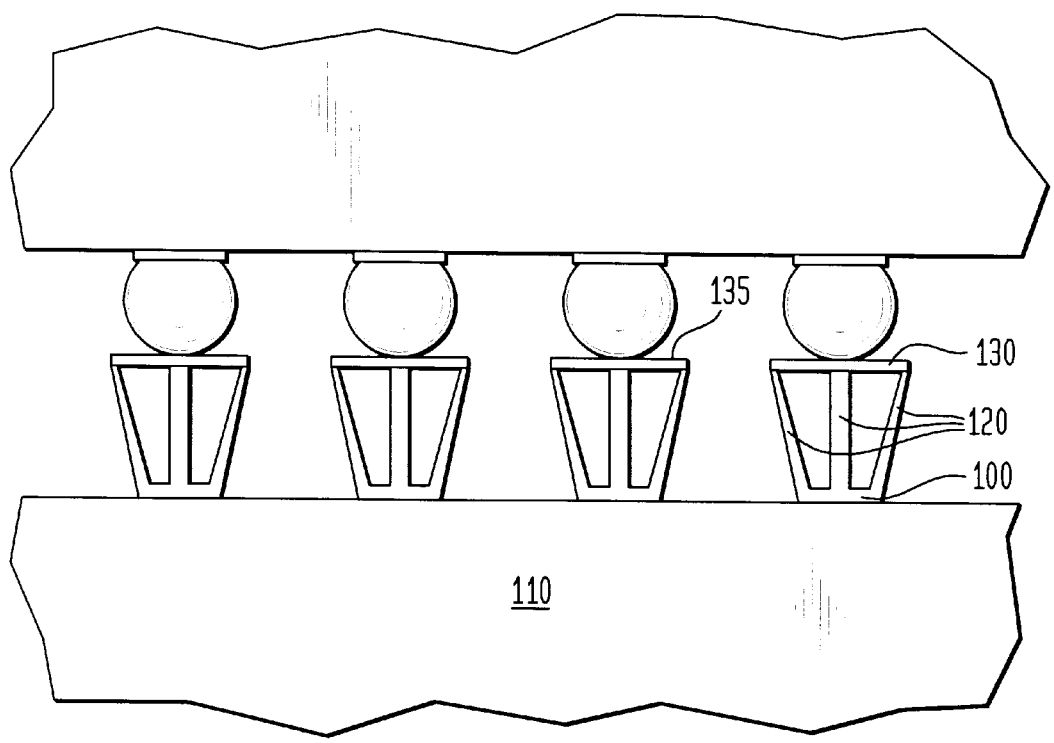
FIG. 7A shows a side view of a plurality of socket contacts for receiving and wiping against solderballs/bump leads inserted therein, according to the present invention.
Figure 7B:
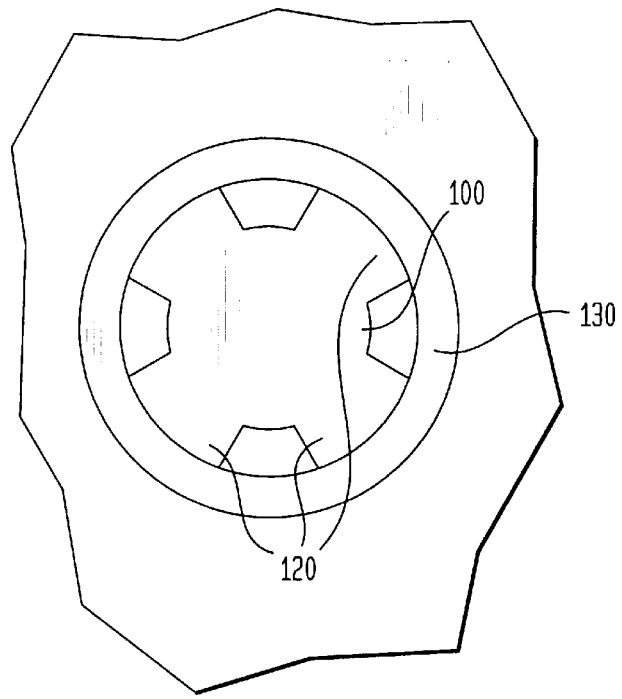
FIGS. 7B and 7C show a bottom view of a socket contact of FIG. 7A in which the base of the socket is either continuous (FIG. 7B) or has a break (FIG. 7C) therein, according to the present invention.

FIGS. 7A–B show a second structure, according to the present invention, in which the flexible contact is fabricated upside-down when compared to the embodiments shown in FIGS. 1–5. In this configuration, the top 100, instead of the base 130, is connected to the supporting substrate 110 thereby providing a "basket-like" structure. This inverted structure can be used as a socket for receiving a solderballs/bump lead (generically referred to as "bump leads" herein). As described in the post contact embodiment above, the flexible legs 110 extend from the base 130 to the top 100 of the socket contact and are substantially vertical with respect to the plane of the substrate 110. The base is comprised of a ring having a central aperture 135 (as described above) which allows the socket to receive the bump leads. The leg or legs 120 of an individual socket may flex laterally (x-y directions) and may also deflect or bow out (z direction) in response to an inserted bump lead. As a bump lead is inserted into a respective socket contact, the bump lead will wipe against the socket's flexible legs thereby removing possible oxide build up on the bump lead and providing better electrical connection between the bump lead and the socket.

The aforementioned socket may be made using the projection lithography methods described above to produce the desired three dimensional features and the substantially vertical legs. However, as shown in FIG. 8, this method involves depositing metal into an aperture or hole in a sacrificial layer rather than depositing metal onto the surfaces of a sacrificial post.

Figure 8:
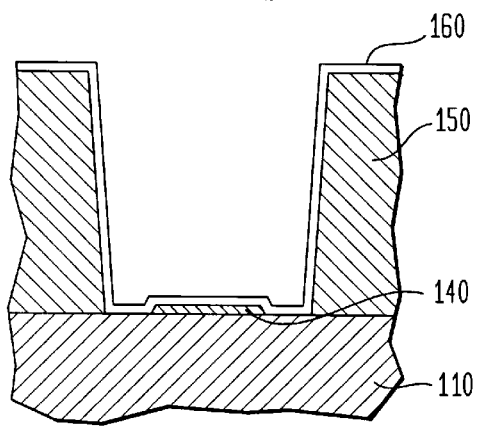
FIGS. 8–10 shows a method for manufacturing the socket contact, shown in FIG. 7A, by projection lithography, according to the present invention.
Figure 9:
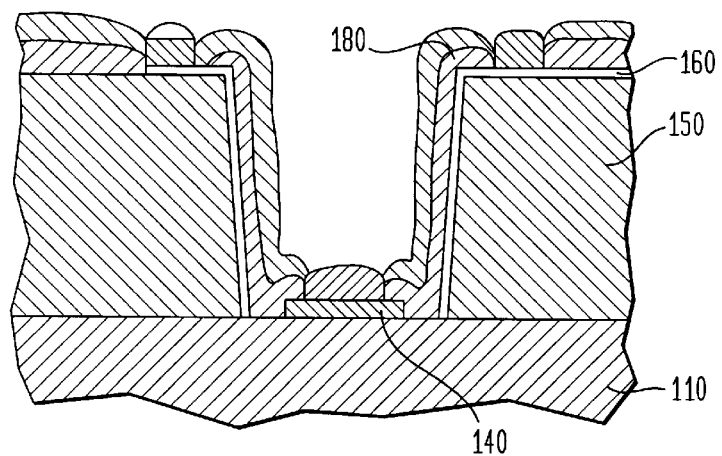
Figure 10:
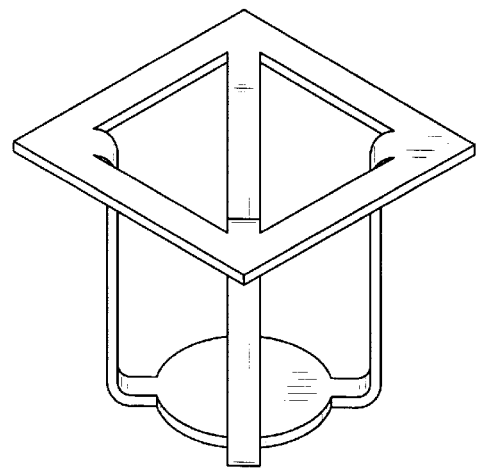

As shown in FIGS. 8–10, a substrate 110 having contacts is first provided. The substrate 110 may be a PWB, a chip carrier, a diced die or chip, an undiced wafer or other suitable support. The substrate is coated with a relatively thick layer of non-conductive sacrificial material 150, as by deposition or lamination. Typically, the sacrificial material 150 is comprised of photoresist material which is applied to the surface of the substrate. As described above in relation to the post contact embodiment, the sacrificial layer 150 is typically between about 100 and 500 microns thick, and preferably about 200 microns thick. The sacrificial layer 150 is next selectively exposed and developed so that holes may be formed therein extending from the exposed surface of the sacrificial layer to each substrate contact below. The undesired portions of the sacrificial layer are then removed leaving at least one aperture which extends down to a contact on the surface of the supporting substrate. The side walls of the apertures are substantially vertical from the substrate to the top of the aperture at the exposed surface of the sacrificial layer. As defined above, the term "substantially vertical" in the terms of this embodiment is defined as a side wall which tapers outwardly from the substrate to the top of the aperture at an angle of typically between about 0 and 20 degrees (θ) relative to a line drawn orthogonal to the plane of the base, and preferably between about 10 and 15 degrees.

A plating seed layer 160 is then deposited on the exposed surfaces of the substrate/sacrificial layer assembly and on the side walls of the at least one aperture. A conformal electrophoretic photoresist layer is then applied to the exposed surfaces of the assembly on top of the seed layer. The resist is then exposed by means of projection lithography in order to selectively expose the three dimensional features for the socket contact (top, leg or legs and base) in the photoresist. The projected energy is used in conjunction with a mask, as described above, to collimate the energy and better define the features of the socket. As also described above, x-ray or deep UV radiation are examples of possible types of projected energy which are suitable as effective, low cost means of performing projection lithography that allow for the patterning of surfaces that are substantially vertical. The photoresist layer is next developed and the undesired portions removed to expose the respective portions of the plating seed layer thereunder.

A metal layer 180 is next electroplated within the removed portions of the photoresist using the thin blanket seed layer as an anode, such as by using an electrolytic sulfamate plating process, as shown in FIG. 9. This metal layer is electroplated to a typical total thickness of between 0.5 and 10 microns, and preferably about 5 microns. In a preferred embodiment, the metal layer is comprised of a layer of nickel electroplated on top of the seed metal in a sulfanate plating bath. Examples of other possible such metal layers include nickel, copper, gold, titanium and alloys and composite combinations thereof.

After this metal layer 180 has been deposited, the electrophoretic photoresist is removed, generally by chemical means, and the seed layer is etched, such as by using a sulfuric acid and hydrogen peroxide etch bath. The sacrificial layer is then also removed leaving the individual sockets themselves, as shown in FIGS. 7A and 10. The remaining three dimensional conductive socket structure, shown in the perspective view in FIG. 10, has a "basket-like" shape, typically having 2, 3, 4 or more legs. An array of such socket contacts maybe simultaneously constructed on a suitable supporting substrate.

If desired, a barrier layer may be electroplated around the surfaces of the socket contacts to obtain better conductivity and ensure that the contacts do not oxidize. Gold is one example of a good barrier layer. The exposed areas may be electroplated in a gold-cyanide bath to a typical thickness of between 0.5 and 10 microns, and preferably about 5 microns.

These basket-like socket contacts may be used to provide a compliant permanent, semi-permanent or test and burn-in socket which may flex in a full range of motion (x-y-z) in response to an inserted bump lead. The aforementioned methods of fabricating the sockets may achieve a height to diameter ratio of about 1 to 1 or greater, thus producing a structure which is inherently flexible if the proper materials are used in its construction. As stated above, the flexible legs are substantially vertical in order to provide lateral (x-y) flexibility. The legs may also bow out in response to a compressive force or an inserted bump lead thereby providing z-compliancy, allowing the legs to wipe against the inserted bump lead and further allowing a range of different sized bump leads to be inserted therein. Further, the socket contacts are comprised of a flexible metal that is substantially uniform in thickness at every point of the contact in order to provide flexible links that exhibit high reliability.

II. Etching

A. Post Contact

The aforementioned stool-like post contact, shown in FIG. 1, may also be created using an etching method. As described above, a conductive base is first attached to a supporting substrate. The base may further be comprised of a continuous conductive sheet or may take the form of a ring.

A post of a sacrificial material is then selectively deposited on top of the base so that a periphery portion of the base is exposed. As described in more detail above, the post is preferably comprised of a material which can be selectively deposited, selectively removed or deposited and selectively manipulated using conventional equipment and chemicals. As described in more detail the alternate embodiments below, the post may also be made of a dielectric material that remains in place, and may be comprised of a low modulus material (100 to $10^5$ psi). The post is typically between about 100 and 500 microns thick, and preferably about 200 microns thick. The post further has substantially vertical side walls.

A plating seed layer, such as palladium, palladium sulfide, carbon or other suitable material, is blanket deposited on top of the exposed surfaces of the substrate and the post. A uniform metal layer is then electroplated or sputtered directly onto the seed layer on top of the substrate and sacrificial post. The metal layer is typically plated to a total thickness of between 0.5 and 10 microns, and preferably about 5 microns. In a preferred embodiment, the metal layer is comprised of a layer of nickel electroplated on top of the seed layer in a sulfanate plating bath. Examples of other possible second metal layers include nickel, copper, gold, titanium and alloys and composite combinations thereof. One preferred metal to be used in an embodiment where sputtering is used to deposit a super-plastic metal material such as a nickel-titanium alloy (known as Nitinol). Such a material has excellent fatigue resistance.

The entire metal layer is then coated with a conformal coating of electrophoretic photoresist material. One possible example of such a resist is Shippley Eagle electrophoretic resist. The resist is then exposed by means of projection lithography in order to selectively expose a three dimensional pattern in the photoresist atop the metallized sacrificial post such that all but the resist over the post socket features may be removed as undesired material. As described above, the projected energy is used in conjunction with a mask to collimate the energy and better define the features of the connector. If x-ray radiation is chosen as the projection energy, a trace amount of organometallic salt may also be added to the photoresist prior to the depositing step in order to better sensitize it to x-rays. The resist is then developed so that the undesired portions of the resist may be removed thereby selectively exposing all of the metal layer except the post connector features of the first metal layer.

After the metal layer has been exposed, the etching step is employed to remove the exposed portions of the metal layer. The rest of the electrophoretic photoresist and the sacrificial post material are next removed, generally by chemical means. The remaining three dimensional conductive contact structure, shown in FIGS. 4A and 4B, has a "stool-like" shape, typically having 3, 4 or more legs.

An array of such post-stool contacts may be simultaneously constructed on a chip, a wafer or a chip carrier substrate using this technique. Such an etching method is preferred when the substrate will be later separated into many devices, such as when the substrate is a semiconductor wafer, or chip carrier, which is to package several chips simultaneously prior to a dicing operation.

As described above, a barrier layer may be electroplated around the surfaces of the post contacts if desired to obtain better conductivity and ensure that the contacts do not oxidize. Gold is one example of a good barrier layer. Typically, the exposed areas are electroplated in a gold-cyanide bath to a typical thickness of between 0.5 and 10 microns, and preferably between about 2 and 5 microns.

The aforementioned method results in a compliant post contact having substantially similar characteristics to the post contact described above in the Plating/Sputtering method.

B. Socket Contact

The aforementioned socket contact for receiving and wiping against solderballs/bump leads inserted therein may also be fabricated using an etching technique.

First, a substrate having contacts is provided. The substrate may be a PWB, a chip carrier, a diced die or chip, an undiced wafer or other suitable support. The substrate is coated with a relatively thick layer of sacrificial material, typically by deposition or lamination, to a thickness of between about 100 and 500 microns, and preferably about 200 microns. The sacrificial material may be comprised of photoresist material. The sacrificial layer is then exposed and developed and the undesired portions of the resist removed so that apertures are formed therein extending from the exposed surface of the sacrificial layer to each substrate contact below. The side walls of the apertures are substantially vertical from the substrate to the top of the aperture at the exposed surface of the sacrificial layer.

A plating seed layer is then blanket deposited on the exposed surfaces of the substrate/sacrificial layer assembly and on the side walls of the aperture. A metal layer is next electroplated or sputtered within the removed portions of the photoresist using the thin blanket seed layer as an anode. This metal layer is deposited to a typical total thickness of between 0.5 and 10 microns, and preferably between about 2 and 5 microns. In a preferred embodiment, the metal layer is comprised of a layer of nickel electroplated on top of the seed metal in a sulfanate plating bath. Examples of other possible such metal layers include nickel, copper, gold, titanium and alloys and composite combinations thereof.

A conformal electrophoretic photoresist layer is then applied to the exposed surfaces of the assembly on top of the metal layer. Projection lithography is then used to expose the resist in order to selectively expose the three dimensional features for the socket contact (top, leg or legs and base) in the photoresist. The projected energy is used in conjunction with a mask, as described above. The photoresist layer is next developed and the undesired portions removed to such that all of the metal layer is exposed except for the contemplated socket features. The exposed portions of the metal layer are next etched away using a suitable etchant solution.

The electrophoretic photoresist and the sacrificial layer are next removed, generally by chemical means, leaving the individual sockets themselves, as shown in FIGS. 7A and 10. As described in the Plating/Sputtering section above, the remaining three dimensional conductive socket structure has a "basket-like" shape, typically having 2, 3, 4 or more legs. An array of such socket contacts maybe simultaneously constructed on a suitable supporting substrate. Further, a barrier layer, such as a uniform layer of gold, may optionally be plated onto the socket contact to a typical thickness of between 0.5 and 10 microns, and preferably about 5 microns. The aforementioned method results in a compliant socket contact having substantially similar characteristics to the socket contact described above in the Plating/Sputtering method.

III. Examples of Additional Structures and Uses

A. Post Contact for Electrical Connector

Figure 6:
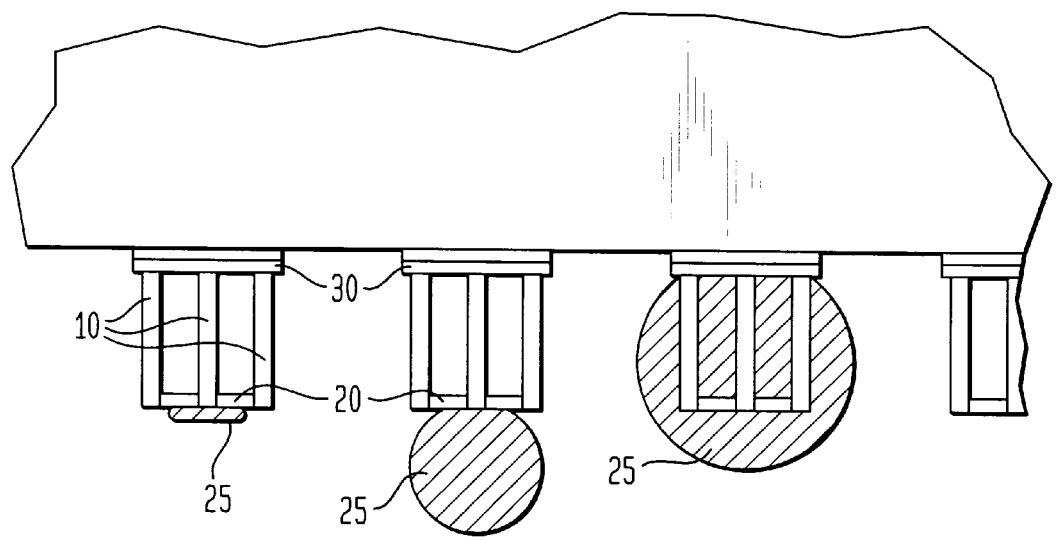
FIG. 6 shows the contact structures in FIGS. 4 and 5 having various suitable bonding materials deposited or attached thereto, according to the present invention.

These post contacts may be used to provide compliant electrical connections between chips and supporting substrates with or without bonding the contacts to the supporting substrates. In one embodiment, a compressive force may be applied to the backs of the chips such as in a socket configuration (permanent or test and burn-in). If desired, however, a bonding material may then be deposited or applied to the tops of the post contacts, as shown in FIG. 6, so that the post contacts may be more permanently attached to the PWB thereby electrically connecting a chip to the PWB. Suitable bonding materials will depend on the metallurgy of the post contact and the associated conductive bond pad of the PWB. If the post-stool contacts are nickel/gold, as described above, and the bond pads have also been plated with a gold layer, a gold filled polyimide siloxane may be used to obtain a thermoplastic bond therebetween. A gold-tin solder may also be used with the aforementioned metallurgy to obtain a gold-tin eutectic bond. If the bond pad is copper or gold, a standard lead-tin eutectic solder may also be used. Further, as shown in FIG. 6, the bonding material will typically be positioned on top of the post-stool contact; however, if a complaint conductive material is used, the bonding material may completely encapsulate the post-stool contact. Many other bonding materials may be used without departing from the concept of the present invention.

Figure 12:
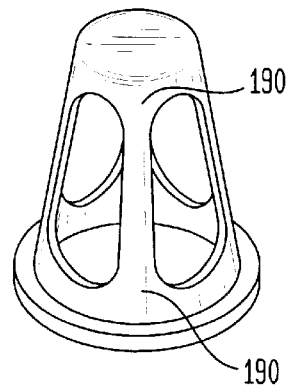
FIG. 12 shows a perspective view of a post contact having flared regions on the post contact legs, according to the present invention.

FIG. 12 shows another possible alternate embodiment which includes creating a flared portion 190 of the post contact legs. The flared portion 190 could be at the leg's point of attachment to the base, its point of attachment to the top or at both the base or the top. The flare 190 starts with a wider portion which narrows as it transitions from the base/top to the leg portions. These flared regions increase each leg's ability to resist fatigue failure due to CTE mismatches of the attached device and substrate during thermal cycling.

Figure 13:
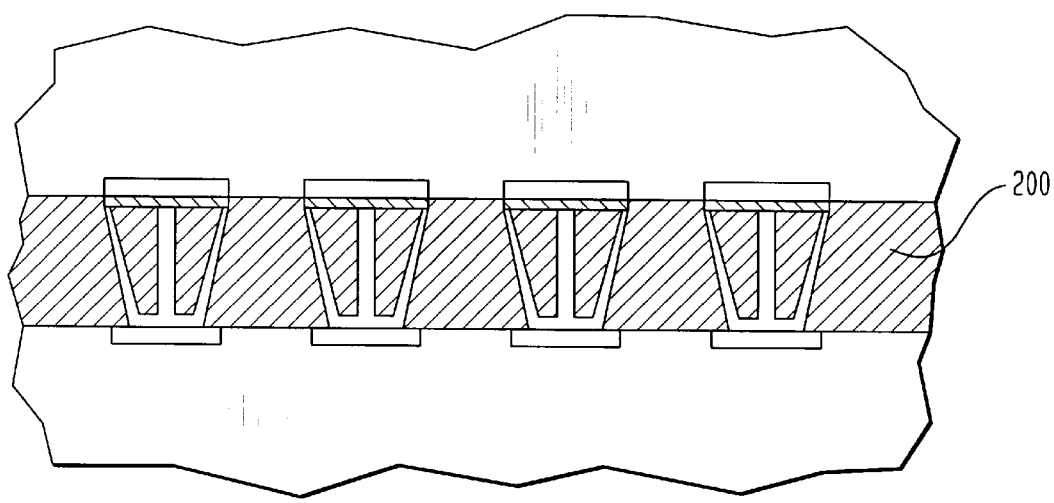
FIG. 13 shows a side view of a plurality of post contacts disposed between and attached to respective chip contacts and PWB contacts and a low modulus encapsulant is disposed between the chip and the PWB and around the post contacts, according to the present invention.

FIG. 13 shows a plurality of post contacts disposed between and attached to respective chip contacts and PWB contacts, as shown in FIG. 6. However, in this embodiment, a low modulus encapsulant 200 is disposed between the chip and the PWB to provide support for the post contacts during thermal cycling of the chip. Such encapsulants 200 may be applied before bonding the post contacts to the PWB; however, preferably the encapsulant is injected between the chip and the PWB after the post contacts have been bonded. Examples of possible encapsulants include silicones, flexibilized epoxies, thermoplastic elastomers, etc.

Figure 14:
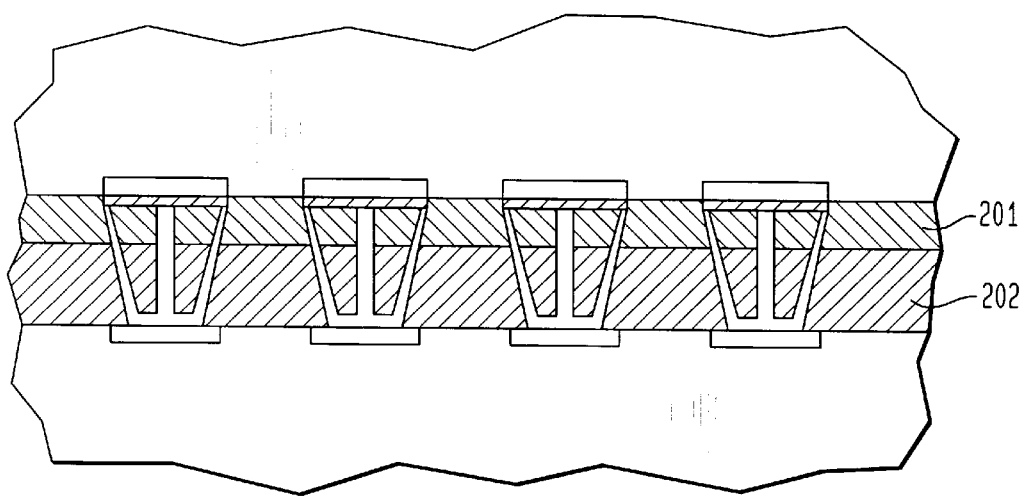
FIG. 14 shows a side view similar to the structure shown in FIG. 13 except that several encapsulant layers are used.

FIG. 14 shows an embodiment similar to that shown in FIG. 13 except that several encapsulant layers are used. In this embodiment, two encapsulation layers are used. A first encapsulant layer 201 is used to encapsulate the base and lower portion of the legs while a second is used to encapsulate the remaining portion of the post contacts. Typically, the first encapsulant is comprised of a rigid or semi-rigid material, such as epoxy, polyimide resin or the like. This first encapsulant layer is used to move the most probable fatigue fracture site from the base-leg transition point to a point further up each of the legs where the legs are not bent and thus have an inherently better resistance to fatigue fracture due to the aforementioned thermal cycling. The second encapsulant 202 is generally comprised of a material having a lower modulus than that of the first encapsulant. This second encapsulant layer is used to support the remainder of the post contacts, as described in the embodiment shown in FIG. 13. A plurality of compliant layers of differing moduluses could be used (instead of just two layers) to provide a gradient of modulus so as to better locate the maximum stress/strain plane on the post contact during operation and thermal cycling. Examples of possible materials include silicone, flexibilized epoxy, thermoplastics and the like.

Figure 15:
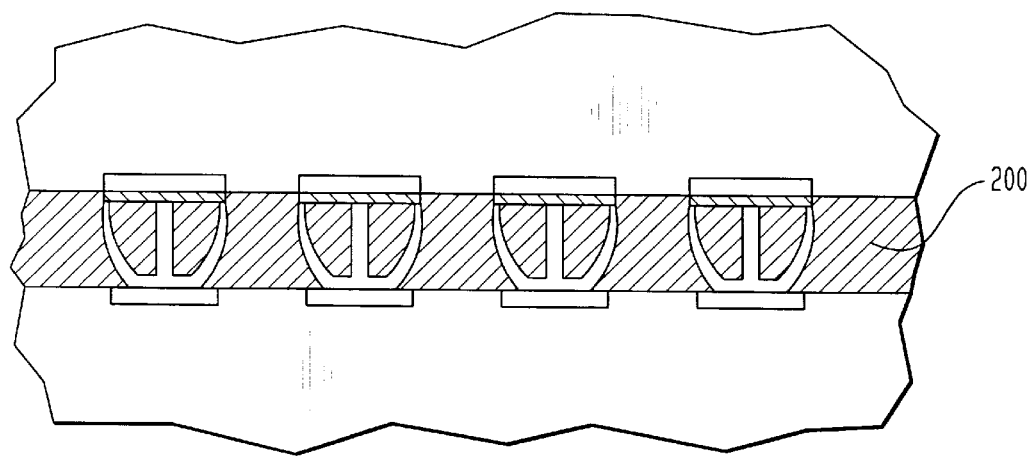
FIG. 15 shows a side view of the structure in FIG. 13 except that the post contacts have been compressed prior to the introduction and/or curing of the encapsulant.

FIG. 15 shows an embodiment similar to that shown in FIG. 13 except that the post contacts have been compressed and formed prior to the encapsulation step. Typically, the post contacts will be attached between the chip contacts and the PWB contacts and compressed by placing pressure on the back of the chip. A low modulus encapsulant is then disposed between the chip and the PWB, as by injection of a liquid encapsulant which is then cured. The encapsulant layer supports the post contacts and makes sure they retain their compressed shape even after the pressure has been removed from the back of the chip. The compressed post contacts have legs which bow out and more readily accommodate lateral movement due to the CTE mismatch during thermal cycling of the chip.

Figure 16:
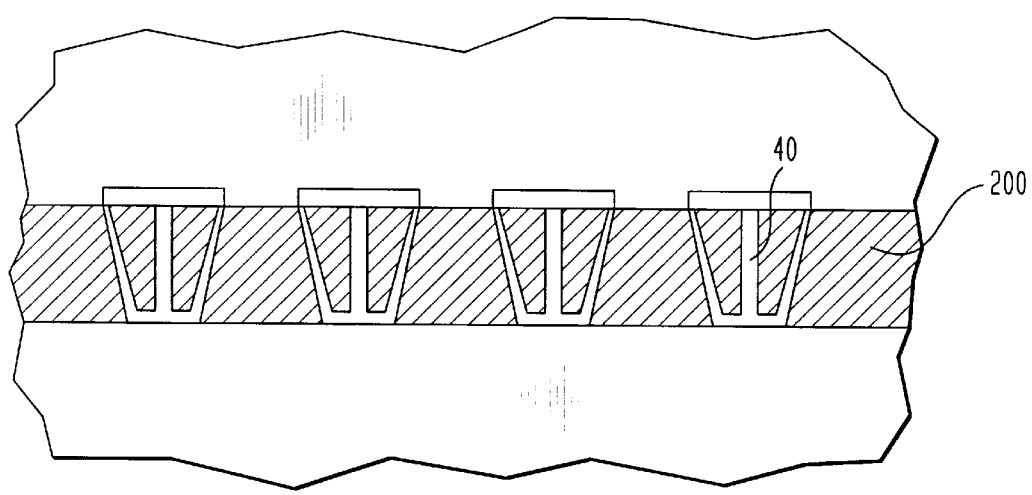
FIG. 16 shows a side view of the structure shown in FIG. 13 except that the dielectric post, shown in FIG. 2, is not removed after the post contact is formed.

FIG. 16 shows an embodiment similar to that shown in FIG. 13 except that a permanent post replaces the sacrificial post, described in the earlier methods. The post contacts are thus formed on top of posts by electroplating, sputtering or etching techniques, as described above; however, the posts are not removed. Typically, the posts are comprised of a dielectric material which has at least some small amount of compliancy, but less compliancy than that found in the encapsulant surrounding the post contacts. The post contacts are thus supported so that they have an improved resistance to thermal cycling.

Figure 17:
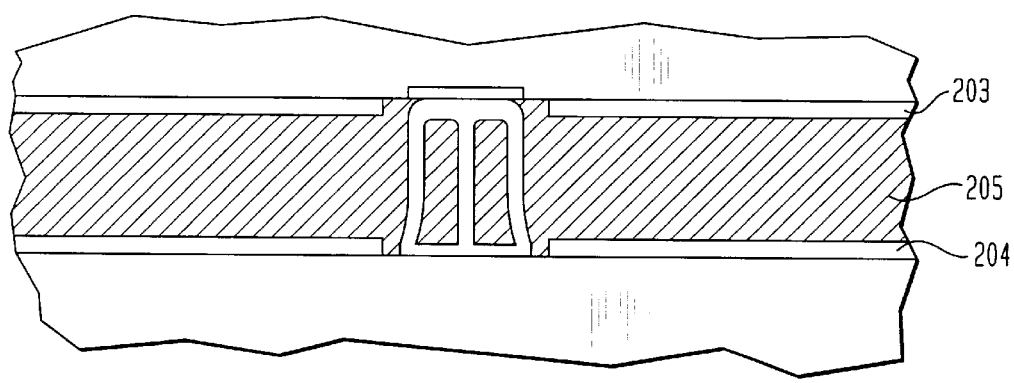
FIG. 17 shows a side view of a post contact, as shown in FIG. 13, except that dielectric layers are deposited or attached to the opposing surfaces of the juxtaposed substrates.

FIG. 17 shows another embodiment wherein a first dielectric layer 204 is disposed on the surface of the supporting substrate, such as a semiconductor chip, and further having apertures therein typically located at the contact locations such that the post contacts may be attached thereto. Typically, the first dielectric layer is comprised of a rigid or semi-rigid material, such as epoxy, polyimide resin, solder mask or the like. This first dielectric layer 204 is used to move the most probable fatigue fracture site from the base-leg transition point to a point further up each of the legs where the legs are substantially vertical and thus have an inherently better resistance to fatigue fracture due to the aforementioned thermal cycling, similar to the function performed by the first encapsulant shown in FIG. 14. A second dielectric layer 203 may also be disposed on the surface of the facing circuitized substrate, such as a PWB. The second dielectric layer 203 has apertures oppositely facing the apertures in the first dielectric layer such that the contacts on the PWB are exposed through the apertures. This second dielectric layer 203 will aid in moving the most probable fatigue fracture site from the top-leg transition point to a point further up each of the legs where the legs are substantially vertical and thus have an inherently better resistance to fatigue fracture. A further variant of this idea is to dispose a low modulus encapsulant 205 between the chip and the PWB in combination with either or both of the first and second dielectric layers. Preferably, this encapsulant is injected after the post contacts are electrically attached between the chip and PWB; however, other suitable methods may be used.

B. Sockets

As described above, the aforementioned basket-like sockets may be used to provide a compliant permanent, semi-permanent or test and burn-in socket which may flex in a full range of motion (x-y-z) in response to an inserted bump lead.

One possible addition to such a socket includes asperities on the interior surface of the socket legs. It is advantageous to provide asperities on the inside surface of the socket legs to aid in the wiping action when bump leads are inserted therein thereby better removing the oxide layer which may be present on the surface of the bump leads. These may be provided by performing a separate plating operation after the socket features have been electroplated, but before the photoresist is removed. In such a plating operation, dendrite/asperities can be formed by electroplating at a high current density. If the settings on such a plating process are performed correctly, small, jagged asperities may be plated on the surface of the legs. Alternately, it is possible to pre-etch the sacrificial layer prior to any plating or sputtering operation such that it has uneven aperture walls. The plating operation will then deposit a conformal layer thereover, thus creating the asperities. In another embodiment, the interior leg surfaces may be slightly etched to form such asperities.

Figure 7C:
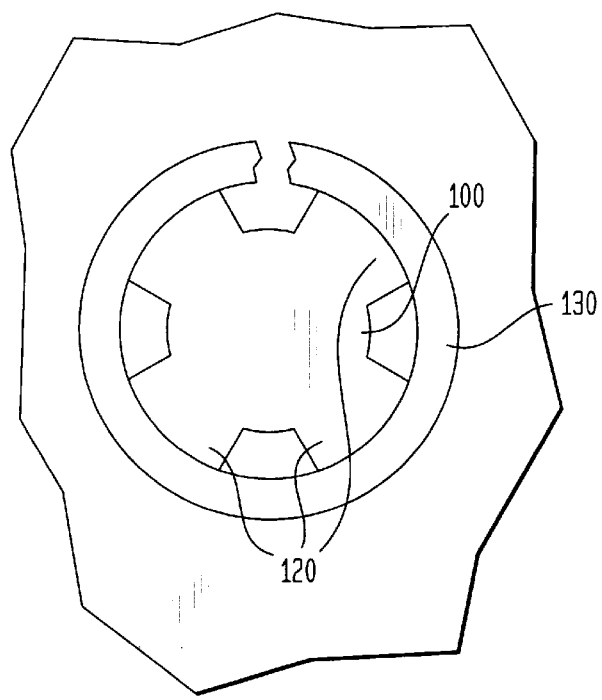

Another possible variant to the socket contacts is to have a break in the ring-like base, as shown in FIG. 7C. This break may be created after the ring base is formed or the photoresist may be developed such that a section of the ring is not removed before the electroplating operation is performed; thus, creating a ring base with a break in it. In one preferable embodiment, a detachable notched section is created when the base is electroplated. When a bump lead having a diameter greater than the interior diameter of the base is inserted, it will cause the aforementioned break in the base at the notch. This break will allow the socket to "open" to accommodate an oversized bump lead to be inserted into the socket. Additionally, if the bump lead is substantially spherical in shape, the base portion will start to close and wrap around the bump lead after it has been inserted past its midpoint.

C. Thermal Contact

Figure 11A:
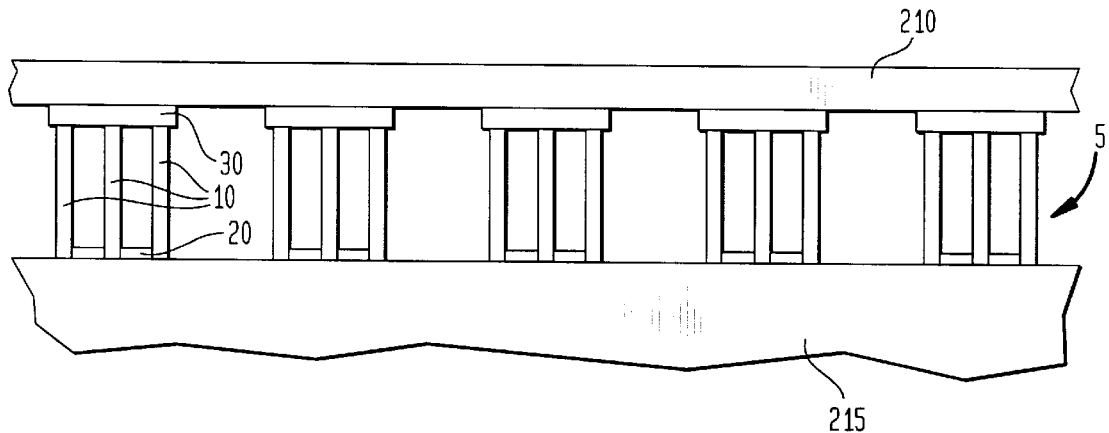
FIGS. 11A–11C show various side views of a thermal contact post used to dissipate heat from semiconductor chips to a thermally conductive top plate, according to the present invention.
Figure 11B:
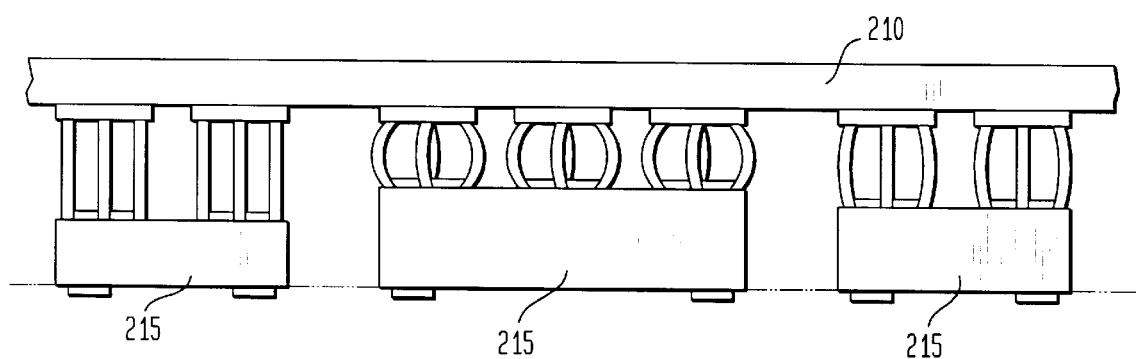

FIG. 11A shows a fragmentary side view of either a plurality of post-stool contacts or sockets (depending on the arrangement of the flexible members and the methods used to create them). These flexible contacts are fabricated using the above methods and are comprised of thermally conductive metallic materials. Thus, these flexible members may be disposed between a semiconductor chip and a thermally conductive top plate 210 and create a flexible heat sink. The top plate 210 may be substantially planar or may have thermally conductive fins extending orthogonally from the surface exposed to the ambient air, as is commonly known in the art. For convenience, these flexible members are typically attached to the top plate. More than one semiconductor chip 215 may then be attached to the same heat sink, as shown in Figure 11B. Such a heat sink having the ability to flex laterally (x-y) in response to each chip's thermal expansion or contraction due to thermal cycling during operation of the chips. Further, since the flexible members have the ability to bow out in response to compressive forces, the chips may be compressed against the heat sink to ensure that all of the chip contacts lie in a single plane thereby better ensuring that all of the contacts will make a good electrical connection to a PWB.

Figure 11C:
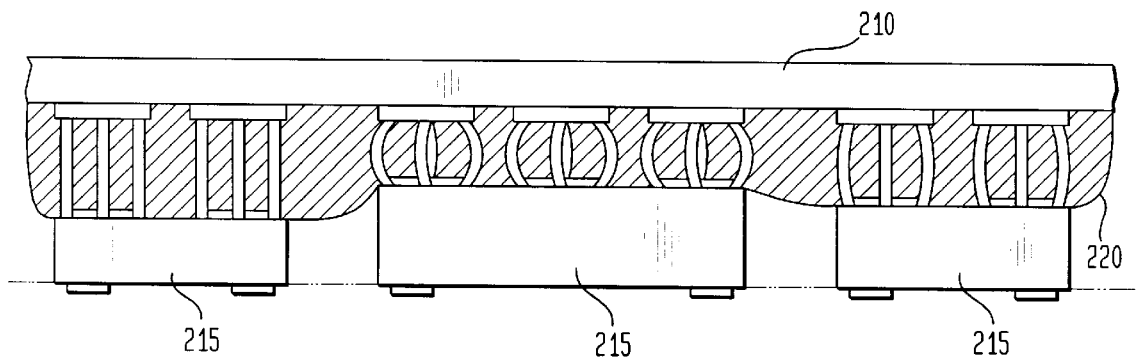

FIG. 11C shows the embodiment depicted in FIG. 11B with an additional conformal, thermally conductive encapsulant 220 disposed between the chips and the thermal top plate 210, similar to the embodiment shown in FIG. 15 where the post contacts have been formed by compression and set by the surrounding encapsulant. Preferably, liquid encapsulant is injected and cured after the top plate 210 has been compressed against the chips 215 to ensure good thermal contact between the tops of the post contacts and the backs of the chips. However, the encapsulant could be applied prior to compression of the top plate against the chips. The thermal encapsulant will improve the thermal conductivity of the assembly and better ensure that the chip contacts are coplanar.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A flexible connector for interconnecting microelectronic devices, comprising:

a plurality of conductive legs each having a first end and a second end;

a top connected to the first end of each leg;

a base conductively interconnecting the second end of each leg together, wherein the top and the base have opposing substantially planar surfaces;

wherein each leg is substantially vertical with respect to the base and the top;

whereby the connector is deflectable in response to relative dimensional changes between the interconnected microelectronic devices.

2. The connector as claimed in claim 1, wherein the connector has three legs.

3. The connector as claimed in claim 1, wherein the connector has four legs.

4. The connector as claimed in claim 1, wherein the base is a conductive contact pad on a semiconductor chip.

5. The connector as claimed in claim 1, wherein the base is a conductive terminal on a first microelectronic device.

6. The connector as claimed in claim 1, wherein the base includes a conductive ring having a central aperture therein, the aperture being positioned beneath the top of the connector.

7. The connector as claimed in claim 1, further including first and second opposing microelectronic devices each having a conductive terminal, wherein the connector top and connector bottom are in engagement with associated conductive terminals on the opposing first and second microelectronic devices.

8. The connector as claimed in claim 7, wherein the connector base is attached to the conductive terminal on the first microelectronic device.

9. The connector as claimed in claim 8, wherein the connector top is bonded to the conductive terminal on the second microelectronic device.

10. The connector as claimed in claim 9, wherein each leg tapers outwardly toward the base and the top from a central region of the leg.

11. The connector as claimed in claim 9, further comprising a compliant, dielectric material disposed between the first and second microelectronic devices and around the connector.

12. The connector as claimed in claim 11, wherein the compliant, dielectric material includes a first layer and a second layer of dielectric material, each such dielectric material having a different modulus of elasticity.

13. The connector as claimed in claim 11, wherein the compliant, dielectric material includes a plurality of layers of dielectric material, each such dielectric material having a different modulus of elasticity.

14. The connector as claimed in claim 11, wherein the first and second microelectronic devices each have a dielectric layer attached or deposited thereto so that the respective dielectric layers face one another, wherein the dielectric layers each have aligned apertures so that the connector is disposed within the apertures.

15. The connector as claimed in claim 9, wherein the first microelectronic device is a flexible, dielectric substrate and the second microelectronic device is a semiconductor chip.

16. The connector as claimed in claim 15, wherein the connector is thermally conductive.

17. The connector as claimed in claim 7, wherein the connector is comprised of thermally conductive material and the first microelectronic device is a thermal plate.

18. The connector as claimed in claim 17, wherein the connector top is abutted against or connected to a back surface of a semiconductor chip.

19. The connector as claimed in claim 18, further comprising a compliant, thermally conductive material disposed between the plate and the back surface of the chip and around the connector.

20. The connector as claimed in claim 1, wherein the base has an electrically conductive region encircling an exposed central aperture and the top is connected to a substrate, said base facing away from said substrate whereby a bump lead extending from a microelectronic device juxtaposed with the substrate may be aligned with the exposed central aperture in the base which is accessible for inserting said bump lead therein causing the base and/or legs to wipe against the bump lead during such insertion.

21. The connector as claimed in claim 20, wherein the base has one or more discontinuities therein, whereby the base may flex outwardly away from the central aperture in response to an inserted bump lead.

22. The connector as claimed in claim 21, wherein the base and/or legs have asperities thereon, whereby the asperities facilitate the wiping of a bump lead inserted into the connector.

23. The connector as claimed in claim 20, wherein each leg tapers outwardly toward the base and the top from a central region of the leg.

24. A method of manufacturing a flexible connector for microelectronic devices, comprising the steps of:
providing a conductive contact on a first microelectronic device;
selectively depositing or attaching a dielectric post on top of the conductive contact, wherein the post has one or more substantially vertical sidewalls and a top surface, the top surface being substantially planar with the conductive contact;
selectively providing one or more connector legs extending from the contact to the top of the post and a substantially conductive connector top on the top of the post connected to each connector leg.

25. The method as claimed in claim 24, further including the step of removing the dielectric post subsequent to the selectively providing step.

26. The method as claimed in claim 25, further comprising the step of electroplating a conductive, substantially non-oxidizing layer around the connector.

27. The method as claimed in claim 24, wherein the selectively providing step further includes the step of providing a base atop the contact and around the post.

28. The method as claimed in claim 24, further including the step of abutting the connector top to a respective contact on a second microelectronic device.

29. The method as claimed in claim 28, further including the step of bonding the connector top to the contact of the second microelectronic device.

30. The method as claimed in claim 29, further including the step of disposing a compliant layer between the first and second microelectronic devices and around the connector.

31. The method as claimed in claim 24, wherein the selectively providing step includes the steps of conformally electroplating or sputtering a first conductive layer atop the base and post, selectively electroplating a second conductive layer and etching undesired portions of the first conductive layer.

32. The method as claimed in claim 24, wherein the selectively providing step includes the steps of conformally electroplating or sputtering a first conductive layer atop the base and post and selectively etching the conductive layer so that the leg and top surface features are defined.

33. The method as claimed in claim 31, wherein the selectively providing step includes the step of using projection lithography to focus energy through a columnating mask to define the leg and top features of the connector.

34. The method as claimed in claim 33, wherein the energy is x-ray or ultraviolet energy.

35. The method as claimed in claim 24, wherein each leg tapers outwardly from a central region of the leg to the top and base of the connector.

36. A method of manufacturing a bump lead socket connector for a microelectronic device, comprising the steps of:
providing a conductive contact on a substrate;
providing a dielectric layer having a selectively defined aperture therein such that the substrate contact is exposed therethrough, wherein the aperture has at least one substantially vertical side wall;
selectively providing at least one conductive leg and a base, wherein the leg extending from the substrate contact to the base and the base has a central aperture therein; and
removing the dielectric layer subsequent to the selectively providing step.

37. The method as claimed in claim 36, wherein the selectively providing step includes the step of conformally electroplating or sputtering a first conductive layer atop the contact and dielectric layer and selectively etching the conductive layer so that the leg and top surface features are defined.

38. The method as claimed in claim 36, wherein the selectively providing step includes the steps of providing a conductive seed layer atop the contact and dielectric layer, providing a conformal photoresist layer, selectively removing areas of the photoresist to expose the seed layer and electroplating the legs on top of the exposed seed layer.

39. The method as claimed in claim 38, wherein the selectively providing step includes the step of using projection lithography to focus energy through a columnating mask to define the features of the connector.

40. The method as claimed in claim 36, further comprising the step of electroplating a conductive, substantially non-oxidizing layer around the connector.

41. The method as claimed in claim 36, wherein each leg tapers outwardly from a central region of the leg to the contact and base of the connector.

42. The method as claimed in claim 36, wherein selectively providing step further includes the step of etching the base of the connector to provide one or more discontinuities therein.

43. The method as claimed in claim 36, wherein selectively providing step further includes the step of selectively electroplating the base of the connector so that the base has one or more discontinuities therein.

44. The method as claimed in claim 36, wherein selectively providing step further includes the step of etching the legs of the connector to provide asperities thereon.

45. The method as claimed in claim 36, wherein selectively providing step further includes the step of selectively electroplating the legs of the connector to provide asperities thereon.

46. A method of interconnecting microelectronic devices using a flexible connector, said method comprising the steps of providing a connector including a plurality of conductive legs each having a first end and a second end, a top connected to the first end of each leg, a base provided on a first microelectronic device conductively interconnecting the second end of each leg, each leg being substantially vertical with respect to the base and the top, and abutting the connector top to a contact on a second microelectronic device, said connector being deflectable in response to relative dimensional changes between the interconnected microelectronic devices.

47. The method as claimed in claim 46, further including the step of bonding the connector top to the contact of the second microelectronic device.

48. The method as claimed in claim 46, further including the step of disposing a compliant layer between the first and second microelectronic devices and around the connector.

49. The method of claim 46, wherein the connector is deflectable in lateral and vertical directions.

50. The method of claim 46, wherein said base is integrally formed with the second end of each leg.

51. The connector as claimed in claim 1, wherein the connector is deflectable in lateral and vertical directions.

52. The connector as claimed in claim 1, wherein said base is integrally formed with the second end of each leg.

53. The connector as claimed in claim 1, wherein the planar surfaces of the base and top are in substantially parallel planes.

* * * * *